(12) United States Patent
Liao et al.

(10) Patent No.: US 12,193,217 B2
(45) Date of Patent: Jan. 7, 2025

(54) METHOD FOR FORMING SEMICONDUCTOR STRUCTURE AND SEMICONDUCTOR STRUCTURE

(71) Applicant: CHANGXIN MEMORY TECHNOLOGIES, INC., Anhui (CN)

(72) Inventors: Chuxian Liao, Hefei (CN); Yuhan Zhu, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 252 days.

(21) Appl. No.: 17/575,149

(22) Filed: Jan. 13, 2022

(65) Prior Publication Data

US 2022/0139924 A1    May 5, 2022

Related U.S. Application Data

(63) Continuation of application No. PCT/CN2021/092896, filed on May 10, 2021.

(30) Foreign Application Priority Data

Jul. 14, 2020    (CN) .......................... 202010673713.X

(51) Int. Cl.
    *H10B 12/00*    (2023.01)
(52) U.S. Cl.
    CPC ....... *H10B 12/482* (2023.02); *H10B 12/0335* (2023.02); *H10B 12/315* (2023.02)
(58) Field of Classification Search
    CPC . H10B 12/482; H10B 12/0335; H10B 12/315
    See application file for complete search history.

(56) References Cited

U.S. PATENT DOCUMENTS

| 8,198,189 B2 | 6/2012 | Kim |
| 8,344,517 B2 | 1/2013 | Kim |

(Continued)

FOREIGN PATENT DOCUMENTS

| CN | 103383935 A | 11/2013 |
| CN | 105280608 A | 1/2016 |

(Continued)

OTHER PUBLICATIONS

International Search Report in the international application No. PCT/CN2021/095606, mailed on Aug. 23, 2021, 2 pgs.

(Continued)

*Primary Examiner* — Samuel A Gebremariam
(74) *Attorney, Agent, or Firm* — Kilpatrick Townsend & Stockton LLP

(57) ABSTRACT

A method for forming a semiconductor structure and the semiconductor structure are provided. The method for forming the semiconductor structure includes: providing a substrate, wherein a separate bit line structure is formed on the substrate; forming a first sacrificial layer on the side wall of the bit line structure; forming a first dielectric layer filling gap between the bit line structures; patterning the first dielectric layer and the first sacrificial layer to form a through hole, wherein the through hole and the remaining first dielectric layer and first sacrificial layer are alternately arranged; forming a second sacrificial layer on the side wall of the through hole, and filling the through hole to form a contact plug; forming a contact structure on the contact plug; and removing the first sacrificial layer to form a first air gap, and removing the second sacrificial layer to form a second air gap.

19 Claims, 22 Drawing Sheets

(56) References Cited

U.S. PATENT DOCUMENTS

| | | |
|---|---|---|
| 8,778,749 B2 | 7/2014 | Pachamuthu |
| 9,123,550 B2 | 9/2015 | Son |
| 9,508,649 B2 | 11/2016 | Lee et al. |
| 9,520,348 B2 | 12/2016 | Choi |
| 9,627,253 B2 | 4/2017 | Kim |
| 9,786,598 B2 | 10/2017 | Kim et al. |
| 10,468,350 B2 | 11/2019 | Kim et al. |
| 10,490,444 B2 | 11/2019 | Choi et al. |
| 10,535,605 B2 | 1/2020 | Kim et al. |
| 10,607,996 B1 | 3/2020 | Sasaki |
| 10,978,397 B2 | 4/2021 | Kim et al. |
| 2010/0285662 A1 | 11/2010 | Kim |
| 2012/0178235 A1 | 7/2012 | Pachamuthu |
| 2012/0217631 A1 | 8/2012 | Kim |
| 2013/0292847 A1 | 11/2013 | Choi |
| 2014/0077333 A1 | 3/2014 | Son |
| 2016/0027727 A1 | 1/2016 | Kim et al. |
| 2016/0211215 A1 | 7/2016 | Lee et al. |
| 2016/0247711 A1 | 8/2016 | Kim |
| 2017/0076974 A1 | 3/2017 | Choi et al. |
| 2018/0040560 A1 | 2/2018 | Kim et al. |
| 2018/0040561 A1 | 2/2018 | Kim et al. |
| 2020/0013668 A1 | 1/2020 | Choi et al. |
| 2020/0118929 A1 | 4/2020 | Kim et al. |
| 2022/0139763 A1* | 5/2022 | Liao ............... H01L 21/7682 257/774 |

FOREIGN PATENT DOCUMENTS

| | | |
|---|---|---|
| CN | 106941097 A | 7/2017 |
| CN | 107706179 A | 2/2018 |
| CN | 107833872 A | 3/2018 |
| CN | 108054153 A | 5/2018 |
| CN | 108206184 A | 6/2018 |
| CN | 108777253 A | 11/2018 |
| CN | 110718550 A | 1/2020 |
| CN | 110875314 A | 3/2020 |

OTHER PUBLICATIONS

International Search Report in the international application No. PCT/CN2021/092896, mailed on Aug. 13, 2021, 3 pgs.

United States Patent and Trademark Office, Non-Final office action issued in related U.S. Appl. No. 17/573,775 on Sep. 3, 2024.

* cited by examiner

METHOD FOR FORMING SEMICONDUCTOR STRUCTURE AND SEMICONDUCTOR STRUCTURE

CROSS-REFERENCE TO RELATED APPLICATIONS

The application is a continuation application of International Application No. PCT/CN2021/092896, filed on May 10, 2021, which claims priority to Chinese Patent Application No. 202010673713.X, filed on Jul. 14, 2020. The disclosures of International Application No. PCT/CN2021/092896 and Chinese Patent Application No. 202010673713.X are hereby incorporated by reference in their entireties.

BACKGROUND

As the integration level of semiconductor devices increases, the distance between adjacent conductive structures decreases. For example, the distance between a bit line structure and a capacitor contact window decreases, the distance between a bit line structure and a capacitor landing pad decreases, and the distance between bit line structures decreases. As the distance between the conductive structures decreases, the parasitic capacitance between the conductive structures will increase, so that the performance of the formed semiconductor device is poor.

In related technique, air gaps are formed to reduce the parasitic capacitance between the conductive structures.

However, the applicant found that in the manufacturing processes of related technique, if the air gaps are made too wide, the air gaps are not easy to seal subsequently; and if the air gaps are made too narrow, the contour uniformity of the air gaps is poor, and the effect of reducing parasitic capacitance is poor.

SUMMARY

The disclosure relates to the field of semiconductors, and particularly relates to a method for forming a semiconductor structure and the semiconductor structure.

The embodiments of the disclosure provide a method for forming a semiconductor structure, which includes operations as follows. A substrate is provided, on which separate bit line structures are formed. A first sacrificial layer is formed on a side wall of each of the bit line structures. A first dielectric layer filling each gap between the bit line structures are formed. The first dielectric layer and the first sacrificial layer are patterned to form through holes, in which along the extension direction of the bit line structures, the through holes and the remaining first dielectric layer and first sacrificial layer are alternately arranged, and the through holes expose active regions in the substrate and the side wall of each of the bit line structures. A second sacrificial layer is formed on a side wall of each of the through holes, and each of the through holes is filled with the second sacrificial layer to form a contact plug. A contact structure is formed on the contact plug. The first sacrificial layer is removed to form a first air gap, and the second sacrificial layer is removed to form a second air gap.

The embodiments of the disclosure further provide a semiconductor structure, which includes a substrate and separate bit line structures located on the top of the substrate; dielectric layer and contact plugs, in which the dielectric layer and the contact plugs are located in gaps between the separate bit line structures, and along the extension direction of the bit line structures, the contact plugs and the dielectric layer is alternately arranged; contact structures located on each of the contact plugs; first air gaps located between the dielectric layer and the bit line structures; and second air gaps surrounding each of the contact plugs, in which a part of each of the second air gaps is located between the corresponding bit line structure and the corresponding contact plug.

DETAILED DESCRIPTION

In the manufacturing processes of related technique, if air gaps are made too wide, the air gaps are not easy to seal subsequently; and if air gaps are made too narrow, the uniformity of the contour of the air gaps is poor, and the effect of reducing parasitic capacitance is poor.

In order to solve the above problem, an example of the disclosure provides a method for forming a semiconductor structure, which includes operations as follows. A substrate is provided, on which separate bit line structures are formed. A first sacrificial layer is formed on a side wall of each of the bit line structures. A first dielectric layer filling each gap between the bit line structures are formed. The first dielectric layer and the first sacrificial layer are patterned to form through holes, in which along the extension direction of the bit line structures, the through holes and the remaining first dielectric layer and first sacrificial layer are alternately arranged, and the through holes expose active regions in the substrate and the side wall of each of the bit line structures. A second sacrificial layer is formed on a side wall of each of the through holes, and each of the through holes is filled with the second sacrificial layer to form a contact plug. A contact structure is formed on the contact plug. The first sacrificial layer is removed to form a first air gap, and the second sacrificial layer is removed to form a second air gap.

In order to make the objectives, technical solutions and advantages of the examples of the disclosure clearer, the examples of the disclosure will be described in detail below with reference to the accompanying drawings. However, a person of ordinary skill in the art can understand that in the examples of the disclosure, many technical details are proposed for readers to better understand the disclosure. However, even without these technical details, and various changes and modifications based on the following examples, the technical solutions claimed in the disclosure can also be realized. The division of the following examples is for the convenience of description, and should not constitute any limitation on the specific implementation manners of the disclosure. The examples can be combined and cited with each other without contradiction.

FIG. 1 to FIG. 22 are schematic cross-sectional views corresponding to each of the steps in a method for forming a semiconductor structure provided by an example of the disclosure. The method for forming the semiconductor structure of the example will be specifically described below.

Figure 1:
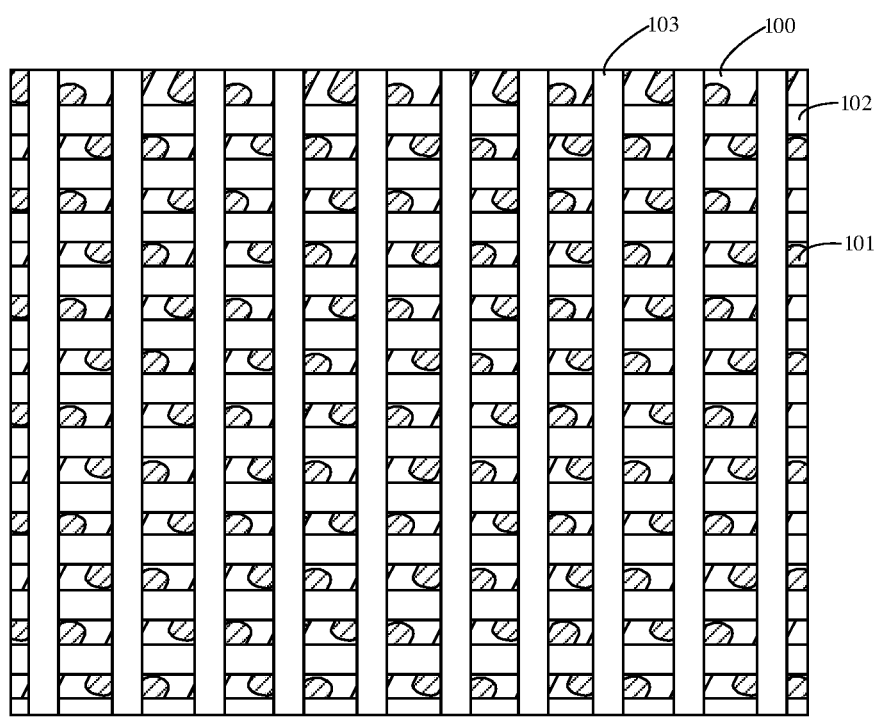
FIG. 1 to FIG. 22 are schematic structural top views and schematic cross-sectional views corresponding to each of the operations in a method for forming a semiconductor structure provided by an example of the disclosure.
Figure 2:
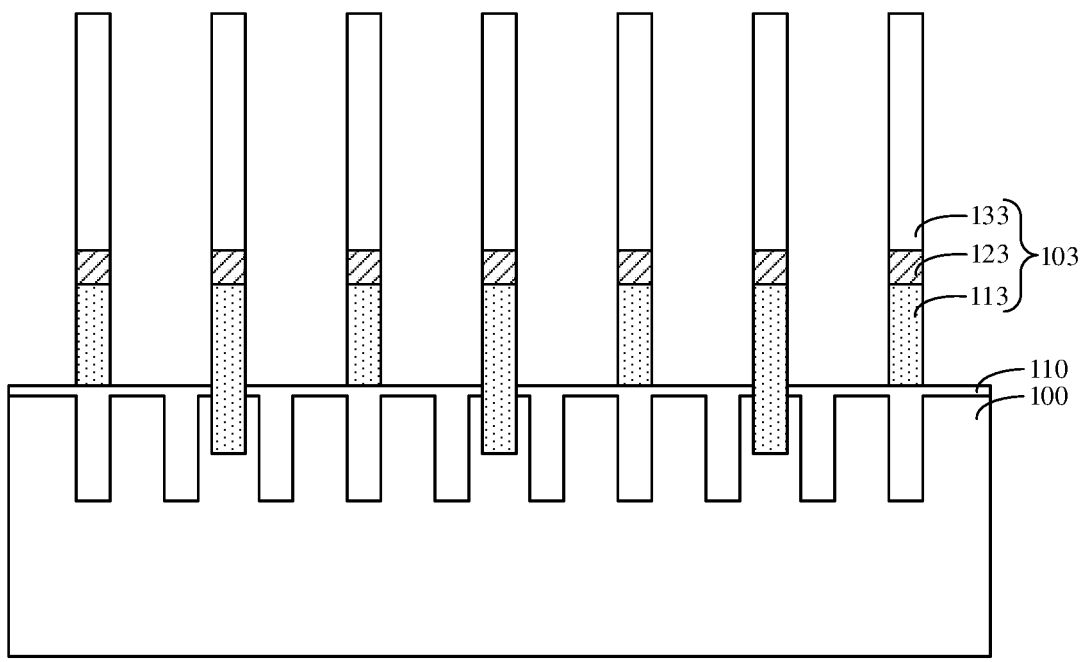

Referring to FIG. 1 and FIG. 2, a substrate 100 is provided, and separate bit line structures 103 are formed on the substrate 100.

Referring to FIG. 1, the substrate 100 including an active region 101 and a word line structure 102 is provided.

A plurality of active region 101 are arranged in parallel at intervals, the word line structure 102 and the bit line structure 103 is perpendicular to each other, and a single active region 101 is overlapped with two word line structures 102. It should be noted that the substrate 100 further includes other semiconductor structures in addition to the word line structure 102 and the active region 101, such as shallow trench isolation structure 110 (referring to FIG. 2), etc. Since other semiconductor structures do not involve the core technique of the disclosure, other semiconductor structures will not be described here. Those skilled in the art can understand that the substrate 100 further includes other semiconductor structures in addition to the word line structure 102 and the active region 101 for normal operation of the semiconductor structure.

The material of the substrate 100 may include sapphire, silicon, silicon carbide, gallium arsenide, aluminum nitride or zinc oxide and the like. In the example, the substrate 100 is made of a silicon material. It should be clear to those skilled in the art that the use of the silicon material as the substrate 100 in the example is to facilitate the understanding of the subsequent method for forming by those skilled in the art, and does not mean to limit. In a practical disclosure, suitable substrate materials may be selected based on requirements.

Referring to FIG. 1 and FIG. 2, separate bit line structures 103 are formed on the substrate 100.

The extension direction of the bit line structure 103 is perpendicular to the extension direction of the word line structure 102. Each of the bit line structures 103 includes a bit line contact layer 113, a metal layer 123 and a top dielectric layer 133 which are stacked in sequence. On a cross section perpendicular to the extension direction of the bit line structure 103, only one of the two adjacent bit line structures 103 is connected to the active region 101 in the substrate 100.

The material of the bit line contact layer 113 includes tungsten or polysilicon. The metal layer 123 may be a conductive material or may be composed of multiple conductive materials, such as doped polysilicon, titanium, titanium nitride, tungsten and tungsten composites. The material of the top dielectric layer 133 includes silicon nitride, silicon dioxide or silicon oxynitride. In the example, the material of the top dielectric layer 133 is silicon nitride.

Figure 3:
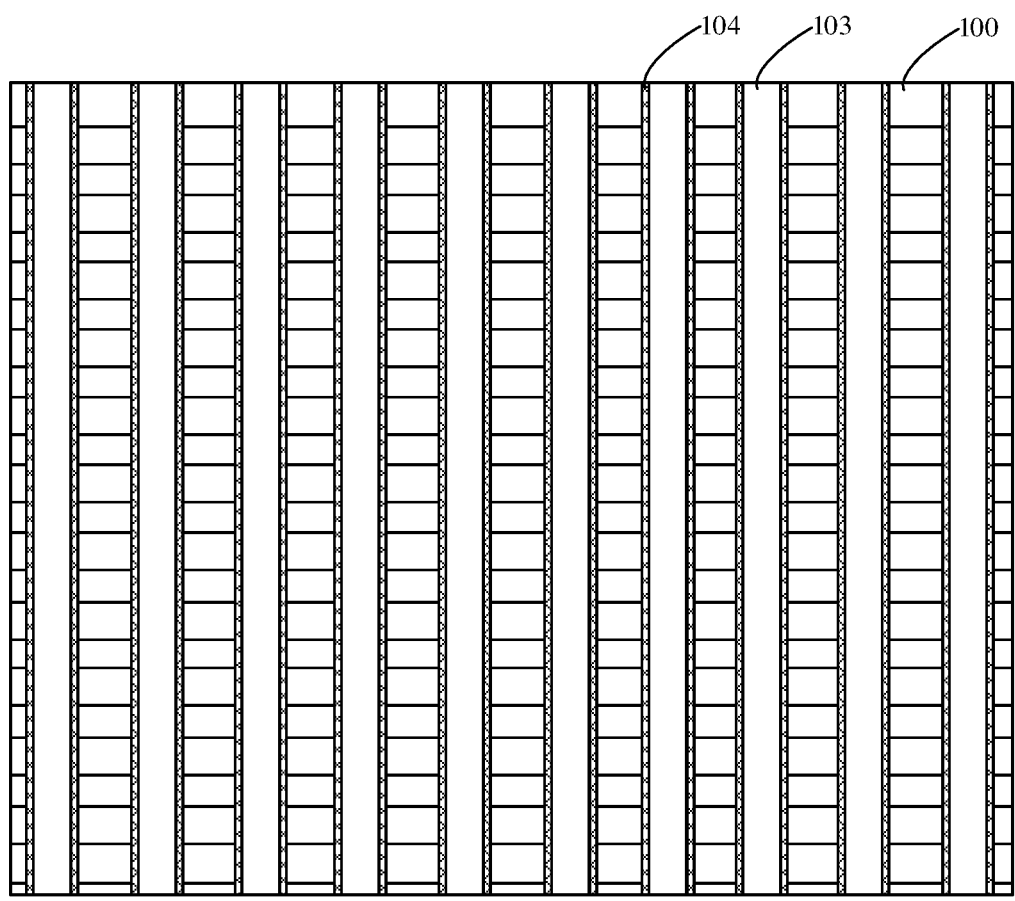
Figure 4:
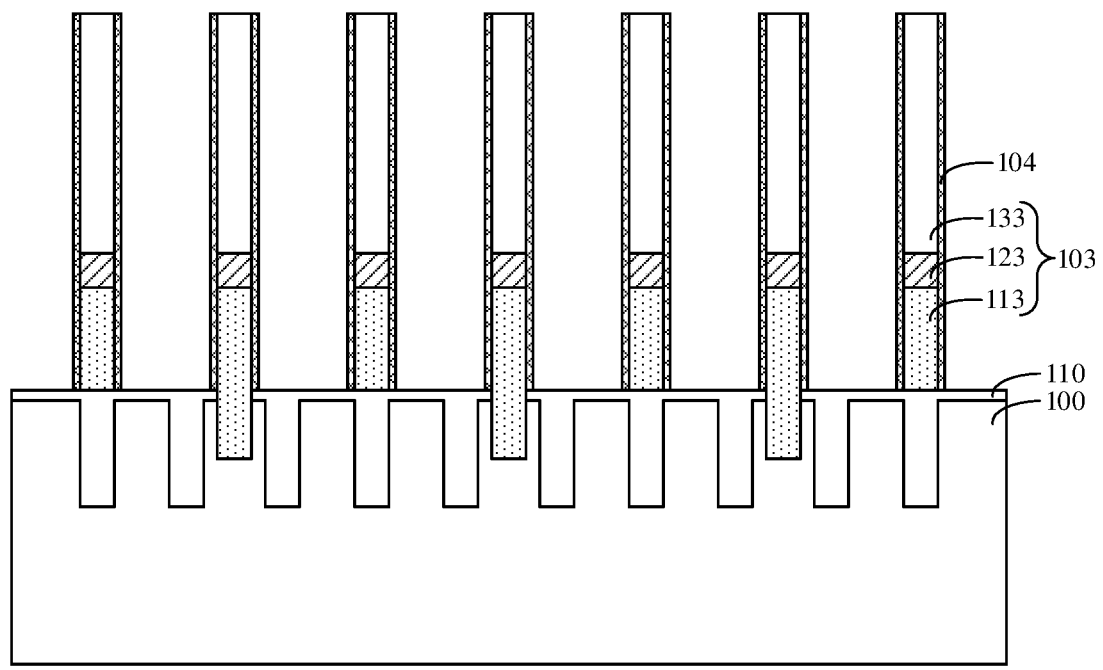

Referring to FIG. 3 and FIG. 4, first sacrificial layer 104 is formed on the side wall of each of the bit line structures 103.

The first sacrificial layer 104 is located on the side wall of each of the bit line structure 103 for subsequent etching to form a first air gap on the side wall of each of the bit line structures 103. That is, the first sacrificial layer 104 is made of a material which is easily etched.

Specifically, the material of the first sacrificial layer 104 is a carbon-containing material. In the subsequent process of removing the first sacrificial layer 104 to form the first air gap, the sacrificial layer may be removed by means of incineration. The incineration gas reacts with the carbon-containing material to generate carbon dioxide gas, and then, the first sacrificial layer 104 is converted into carbon dioxide gas, thereby removing the first sacrificial layer 104. Furthermore, the collapse phenomenon caused by a larger impact on the side wall of air isolation structure in the process of forming the air gap is avoided. In other examples, the first sacrificial layer may be made of a material having a high etching selection ratio to the surrounding materials, such as silicon oxide. The first sacrificial layer is removed by a wet etching process, thereby forming the first air gap.

In the example, along the direction parallel to the surface of the substrate 100, the thickness of the first sacrificial layer 104 is 0.1 nm to 5 nm, such as 0.5 nm, 1.0 nm, 1.5 nm, 2.0 nm, 2.5 nm, 3.0 nm, 3.5 nm, 4.0 nm or 4.5 nm.

Specifically, a first sacrificial film is formed on the side wall of the bit line structure 103 and the top surface of the substrate 100. In the example, the first sacrificial films are formed by an atomic layer deposition (ALD) process, and the first sacrificial film formed by the ALD process has good coverage. In other examples, for example, the first sacrificial film may be formed by a chemical vapor deposition (CVD) process at 500° C. or 600° C. It should be noted that the above examples of specific temperature parameters for the CVD are only for the understanding of those skilled in the art, and do not mean to limit this solution. In practical application, the parameters in the above range fall within the protection scope of the disclosure.

The first sacrificial film on the top surface of the substrate 100 is removed to form first sacrificial layer 104. At this time, the formed first sacrificial layer 104 is only located on the side wall of each bit line structure 103.

Referring to FIG. 5 to FIG. 14, a first dielectric layer 106 filling the gap between adjacent bit line structures 103 is formed, and the first dielectric layer 106 and the first sacrificial layer 104 are patterned to form through holes 107. The through hole 107 exposes active region 101 in the substrate 100. Along the extension direction of the bit line structure 103, the through hole 107 and the remaining first dielectric layer 106 and first sacrificial layer 104 are alternately arranged, and the side wall of the through hole 107 exposes the side wall of the bit line structure 103. A second sacrificial layer 108 is formed on the side wall of the through hole 107, and the through hole 107 is filled to form contact plug 109.

Figure 5:
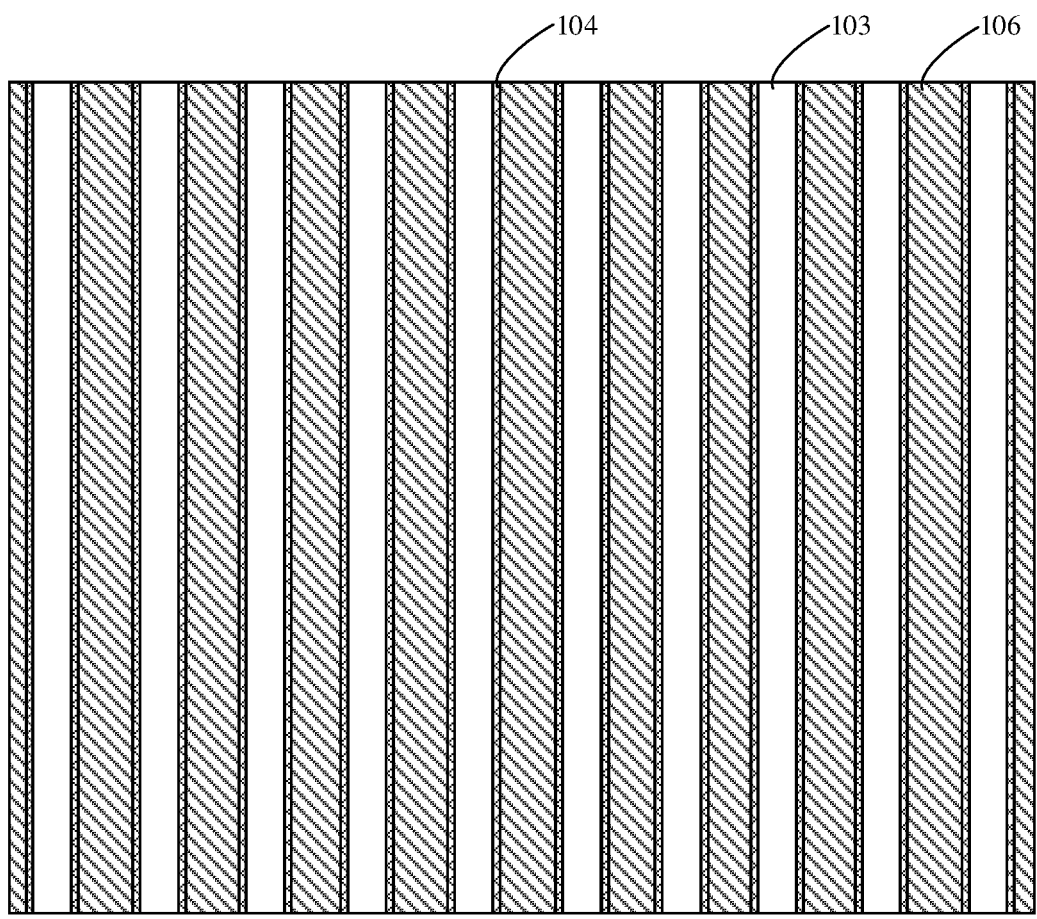
Figure 6:
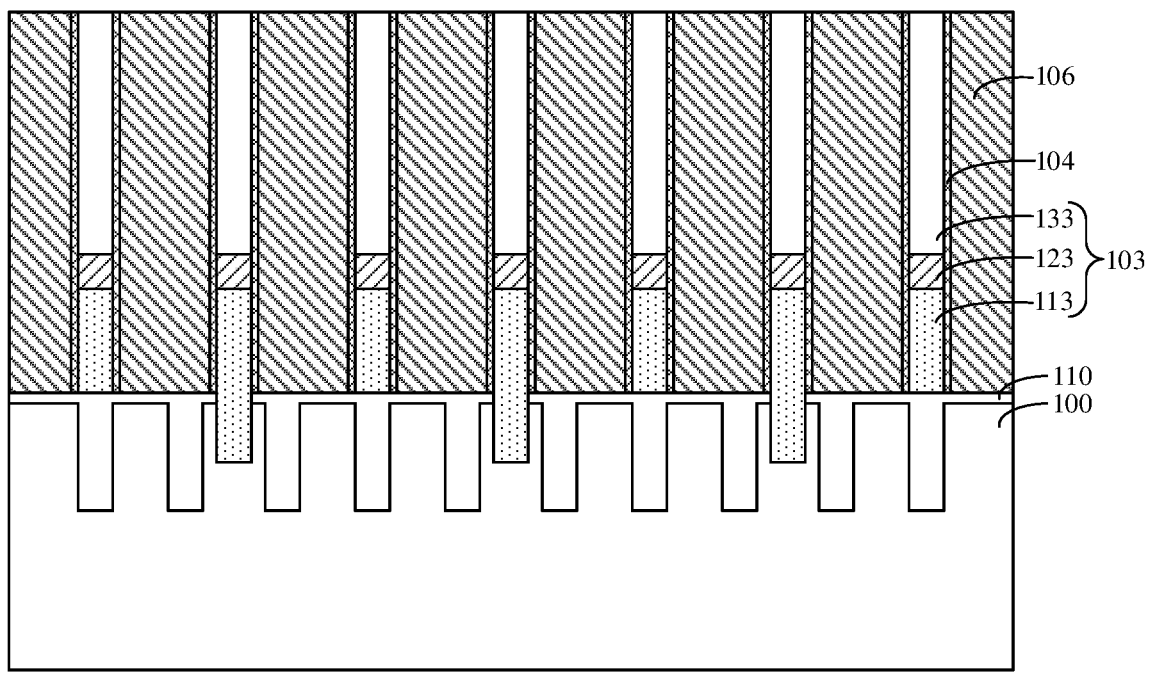

Specifically, referring to FIG. 5 and FIG. 6, a first dielectric layer 106 filling gaps between adjacent bit line structures 103 is formed.

Figure 7:
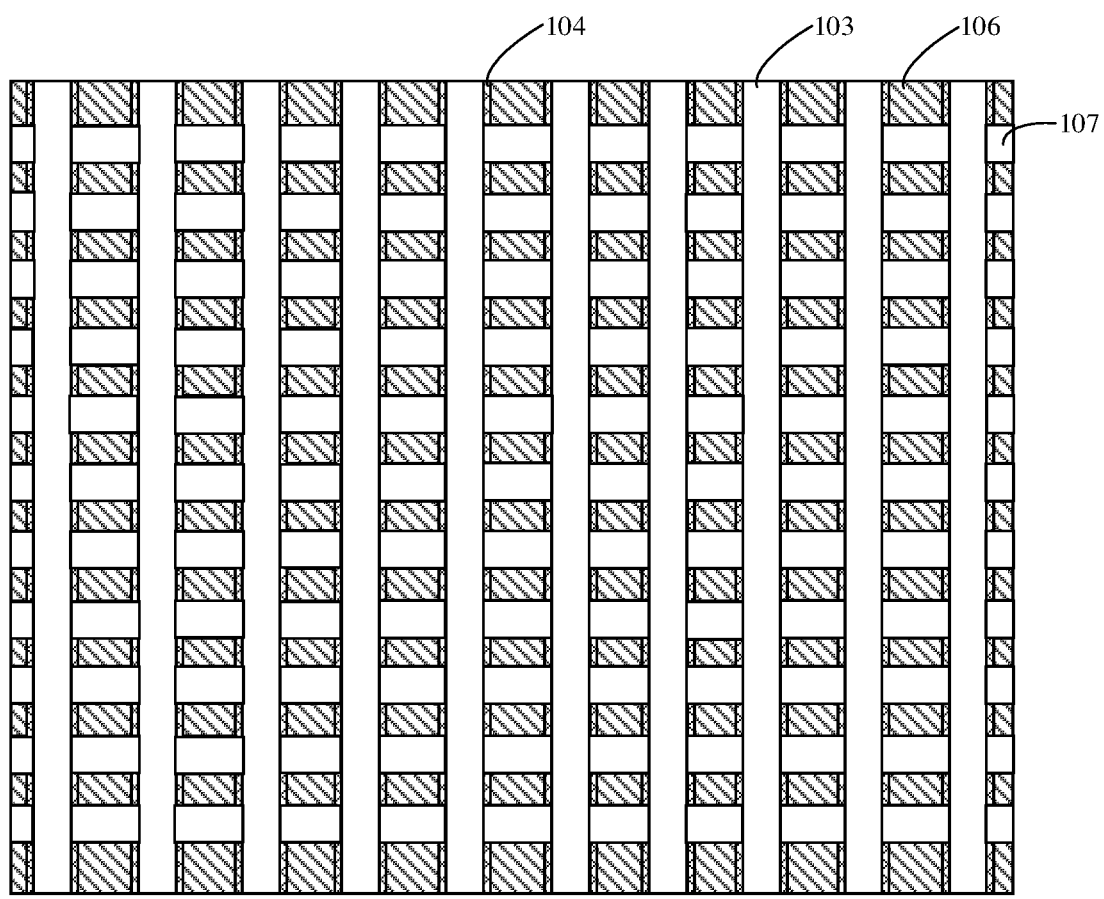
Figure 8:
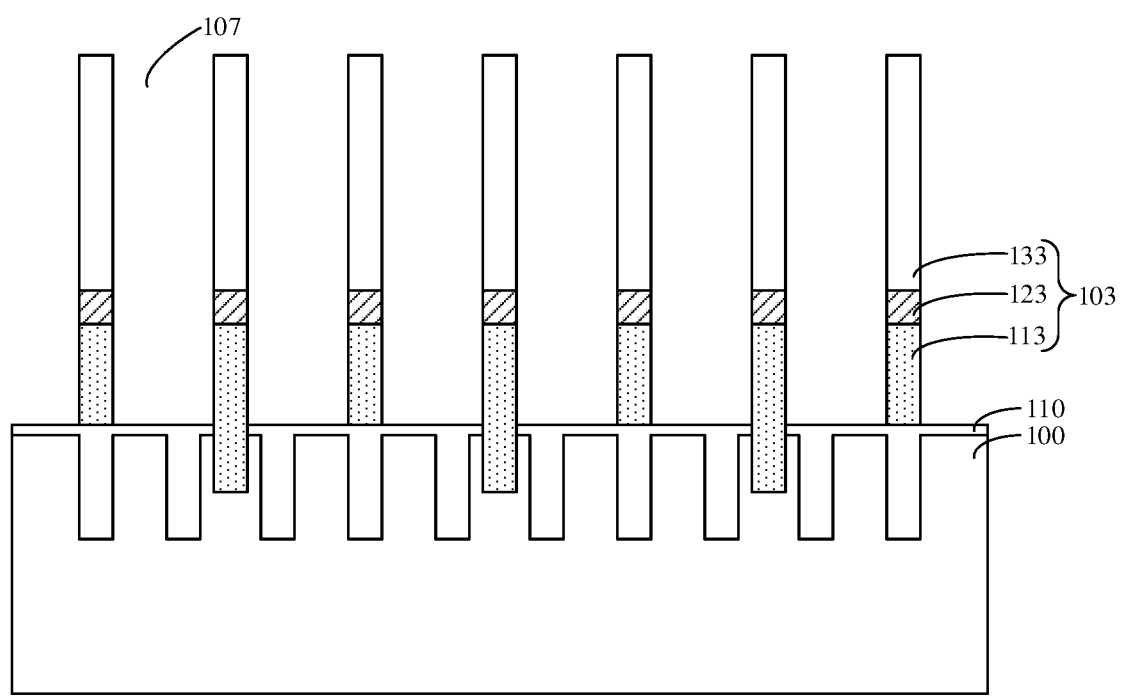

Referring to FIG. 7 and FIG. 8, in the example, the first dielectric layer 106 and the first sacrificial layer 104 are patterned to form through hole 107, which includes operations in which a first mask layer is formed on the bit line structure 103 and the first dielectric layer 106. The first mask layer is patterned to form first etching openings, in which along the extension direction of the bit line structure 103, the first mask layer and the first etching opening are alternately arranged. The exposed first dielectric layer 106 and first sacrificial layer 104 on the side wall of the bit line structure 103 are etched based on the first etching openings to form the through hole 107. Specifically, the material of the formed first dielectric layer 106 is different from the material of the top dielectric layer 133. The first etching opening is linear pattern intersected with the extension direction of the bit line structure 103, and self-aligned etching is performed by means of the linear pattern and the etching selection ratio of the first dielectric layer 106 and the top dielectric layer 133 to form the through hole 107.

In an example, the material of the top dielectric layer 133 is silicon nitride, the material of the first dielectric layer 106 is silicon oxide, and the material of the first sacrificial layer 104 is a carbon-containing material, such as amorphous carbon and silicon oxycarbide. Self-aligned etching is performed by means of the etching selection ratio of the silicon oxide and the silicon nitride and the etching selection ratio of the carbon-containing layer and the silicon nitride to remove the silicon oxide and the carbon-containing layer to form the through hole 107. In other examples, a part of the substrate at the bottom of the first dielectric layer needs to be etched so as to expose the active region in the substrate.

In other examples, the first dielectric layer and the first sacrificial layer is patterned to form through hole, which includes the operations as follows. A first mask layer is formed on the bit line structure and the first dielectric layer. The first mask layer is patterned to form first etching openings, in which along the extension direction of the bit line structure, the first mask layer and the first etching openings are alternately arranged. A part of the first dielectric layer is removed by the first etching openings. A second mask layer is formed on the remaining first dielectric layer. The second mask layer is patterned to form second etching openings, which expose the first sacrificial layer on the side wall of each first etching opening. The first sacrificial layer on the side wall of the first etching opening is removed based on the second etching opening to form the through holes.

Figure 9:
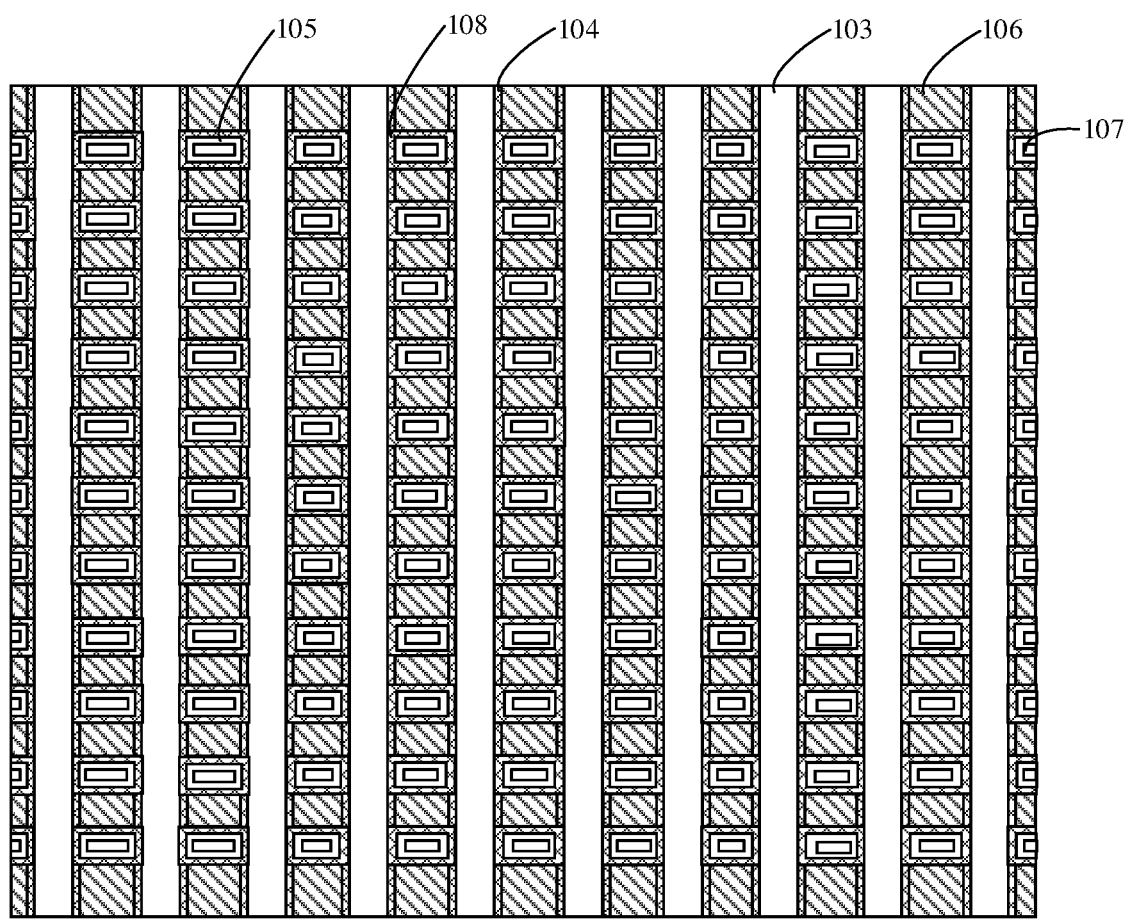
Figure 10:
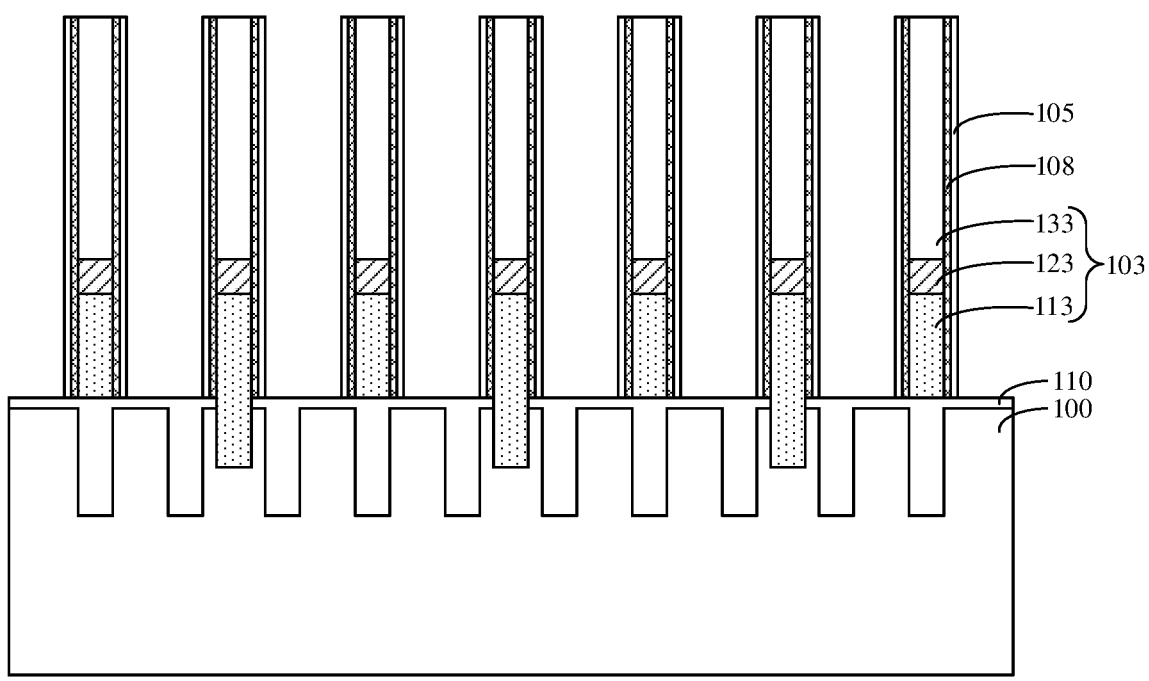

Particularly, firstly, the first dielectric layer is etched by the first mask layer and the first etching opening, and then, the first sacrificial layer is etched by the second mask layer and the second etching opening. This arrangement increases the adjustability of the process. In addition, a part of the substrate at the bottom of the first dielectric layer may also be etched so as to expose the active region in the substrate. Referring to FIG. 9 and FIG. 10, a second sacrificial layer 108 is formed on the side walls of each through hole 107. The second sacrificial layer 108 is located on the side walls of each through hole 107 for subsequent etching to form second air gap surrounding the side walls of each through hole 107. That is, the second sacrificial layer 108 is made of a material which is easily etched.

Specifically, the material of the second sacrificial layer 108 is a carbon-containing material. In the subsequent process of removing the second sacrificial layer 108 to form air gaps, the sacrificial layer may be removed by means of incineration. The incineration gas reacts with the carbon-containing material to generate carbon dioxide, so that the solid second sacrificial layer 108 is converted into carbon dioxide gas, thereby removing the sacrificial layer. Furthermore, the collapse phenomenon caused by the relatively greater impact on the side walls of air isolation structures in the process of forming the air gaps is avoided. In the example, the method for forming the second sacrificial layer 108 is the same as the above method for forming the first sacrificial layer 104, which will not be repeated here.

In other examples, the first sacrificial layer 104 and the second sacrificial layer 108 may be removed by a wet etching process.

In the example, the thickness of the second sacrificial layer 108 is greater than the thickness of the first sacrificial layer 104. Since the second sacrificial layer 108 formed around each contact plug 109 have corners, it is more difficult to be removed than the first sacrificial layer 104 under the same width. The thickness of the second sacrificial layer 108 is greater than the thickness of the first sacrificial layer 104 so as to ensure that the second sacrificial layer 108 may be completely removed.

In the example, the thickness of the second sacrificial layer 108 is 1 nm to 6 nm, such as 1 nm, 2 nm, 3 nm, 4 nm or 5 nm.

It should be noted that in other examples, the thickness of the second sacrificial layer may also be set to be same as the thickness of the first sacrificial layer, or may be less than the thickness of the first sacrificial layer.

In the example, before the bottom conductive layer that fills in each through hole 107 is formed, the method further includes an operation in which an isolation layer 105 is formed on the side walls of the second sacrificial layer 108.

Figure 11:
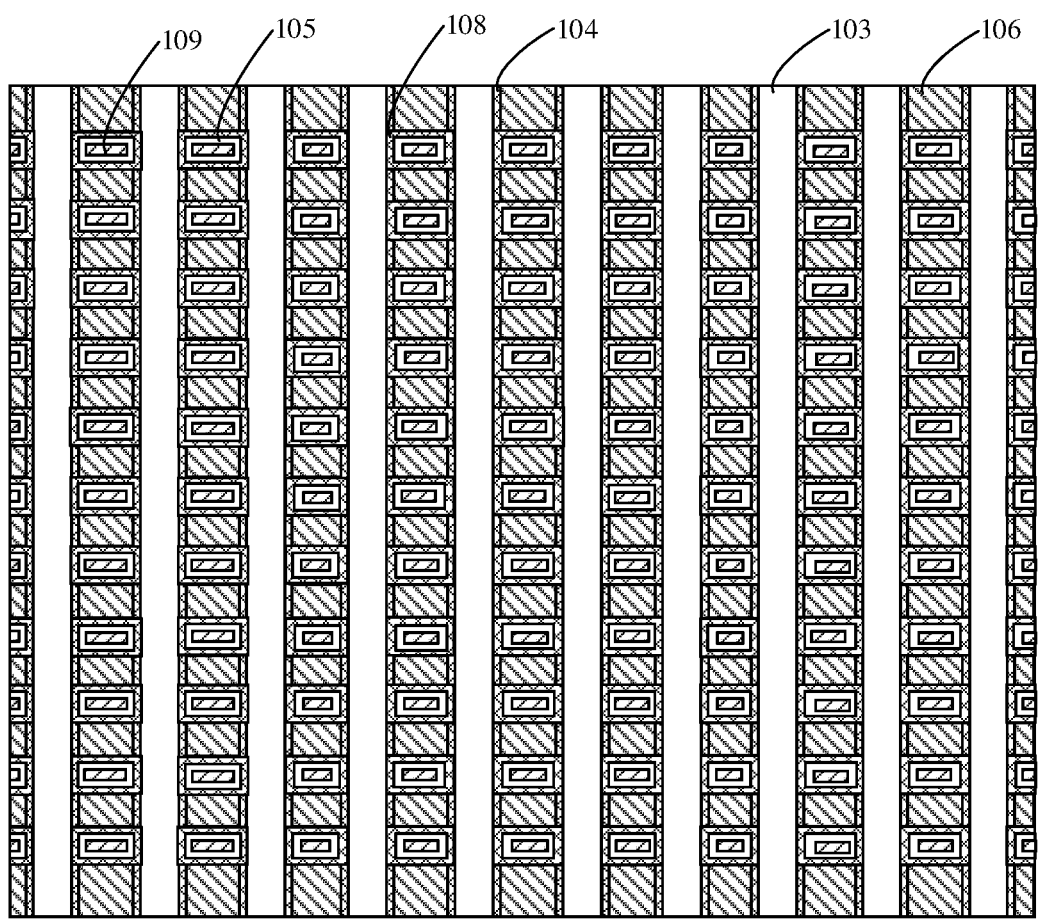
Figure 12:
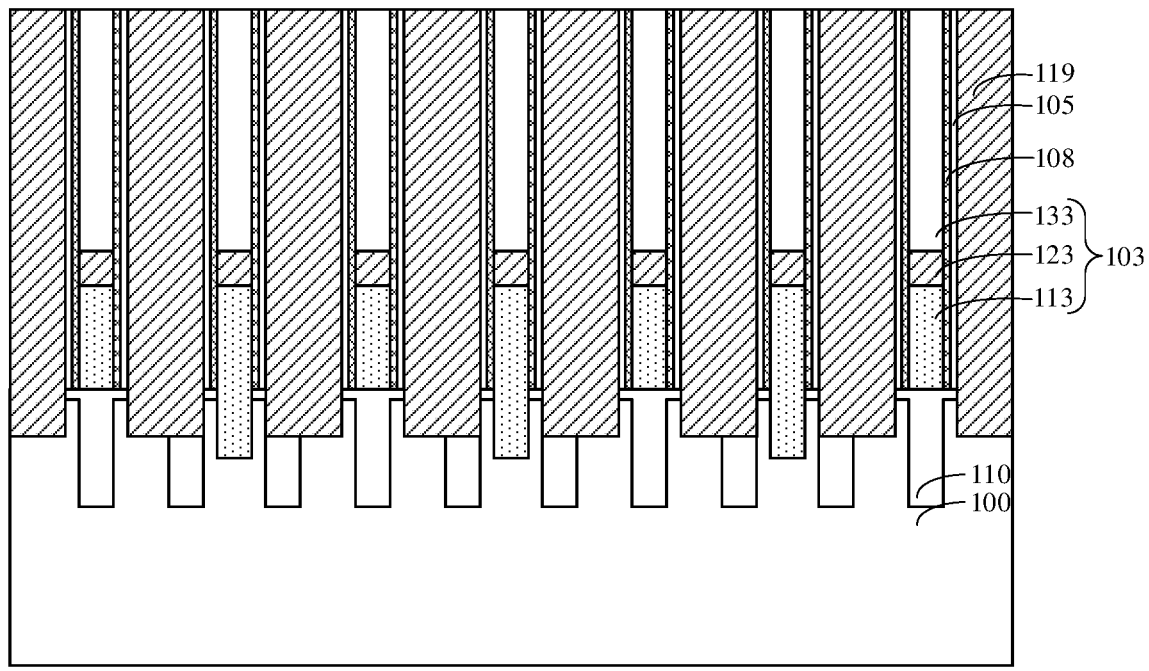
Figure 13:
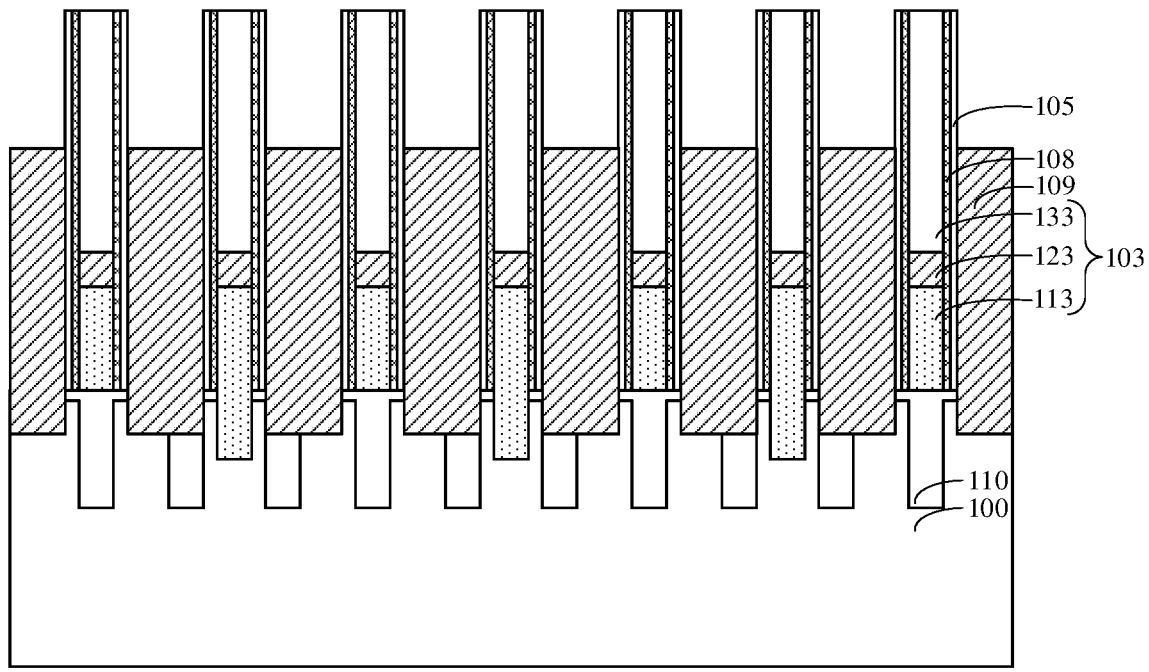

Referring to FIG. 11 to FIG. 13, each of the through holes 107 is filled to form the contact plug 109.

Specifically, referring to FIG. 12, a through hole 107 is filled to form a bottom conductive layer 119. The height of the bottom conductive layer 119 is the same as the height of the bit line structure 103. The material of the bottom conductive layer is polysilicon or silicon germanide for forming an electrical connection with the active region 101 in the substrate 100.

Referring to FIG. 13, the bottom conductive layer 119 is partially etched to form the contact plug 109, and the contact plug 109 is lower than the top surface of the bit line structure 103.

After the through hole 107 is filled to form the contact plug 109 and before the contact structure is formed on the contact plug 109, the method further includes an operation in which an electrical connection layer (not shown) is formed on the contact plug 109. By forming the electrical connection layer (not shown) between the contact plug 109 and the contact structure, the transmission loss of the current between the contact plug 109 and the contact structure is reduced.

Figure 14:
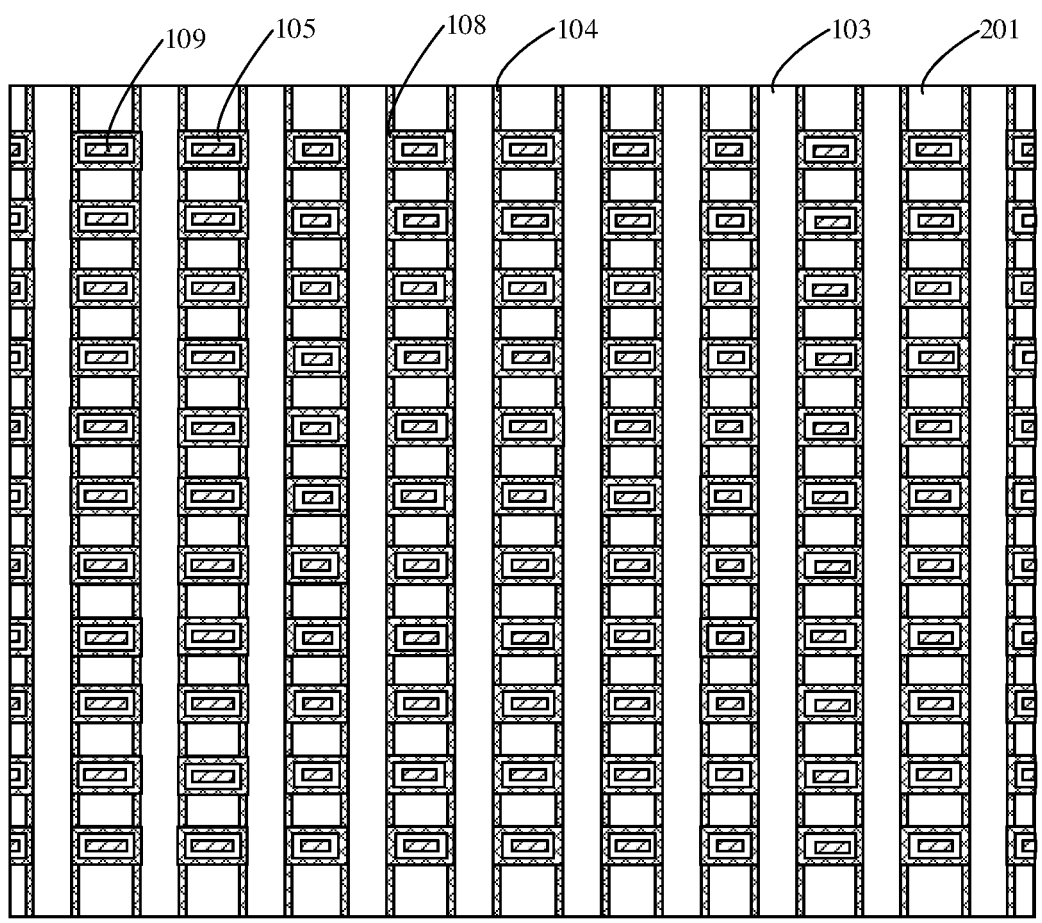

In the example, referring to FIG. 14, after the through hole 107 is filled to form the contact plug 109 and before the contact structure is formed on the contact plug 109, the method further includes operations as follows. The remaining first dielectric layer 106 is removed to form a dielectric opening; and a second dielectric layer 201 filling the dielectric opening is formed. Specifically, utilizing different materials of the first dielectric layer 106 and the surrounding top dielectric layer 133 and the contact plug 109, the first dielectric layer 106 may be etched in a self-aligned manner to form the dielectric opening, so that the process cost is saved. Meanwhile, the through hole 107 is formed on the first dielectric layer 106 by etching, and the second dielectric layer 201 replace the first dielectric layer 106 as an isolation dielectric, so that the adjustment redundancy of the process is larger. For example, the silicon dioxide which is easy to be etched is used to form the first dielectric layer 106 to reduce the etching difficulty of the through hole 107, and the silicon nitride is used to form the second dielectric layer 201 to achieve a better isolation effect.

Figure 15:
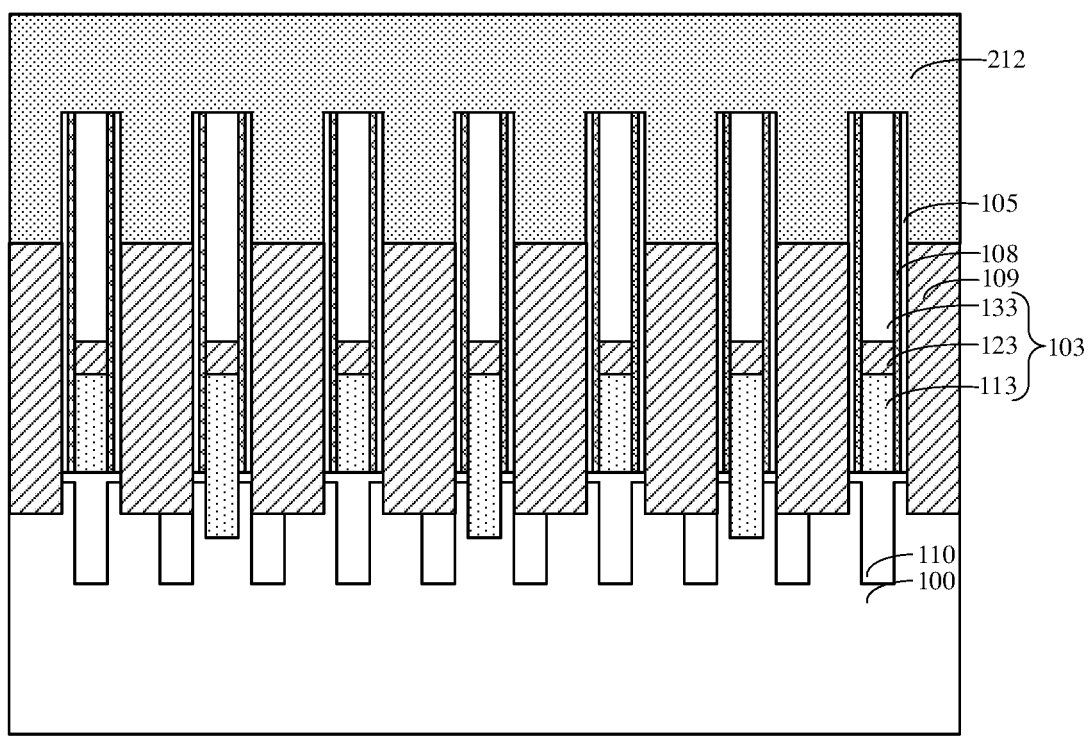
Figure 16:
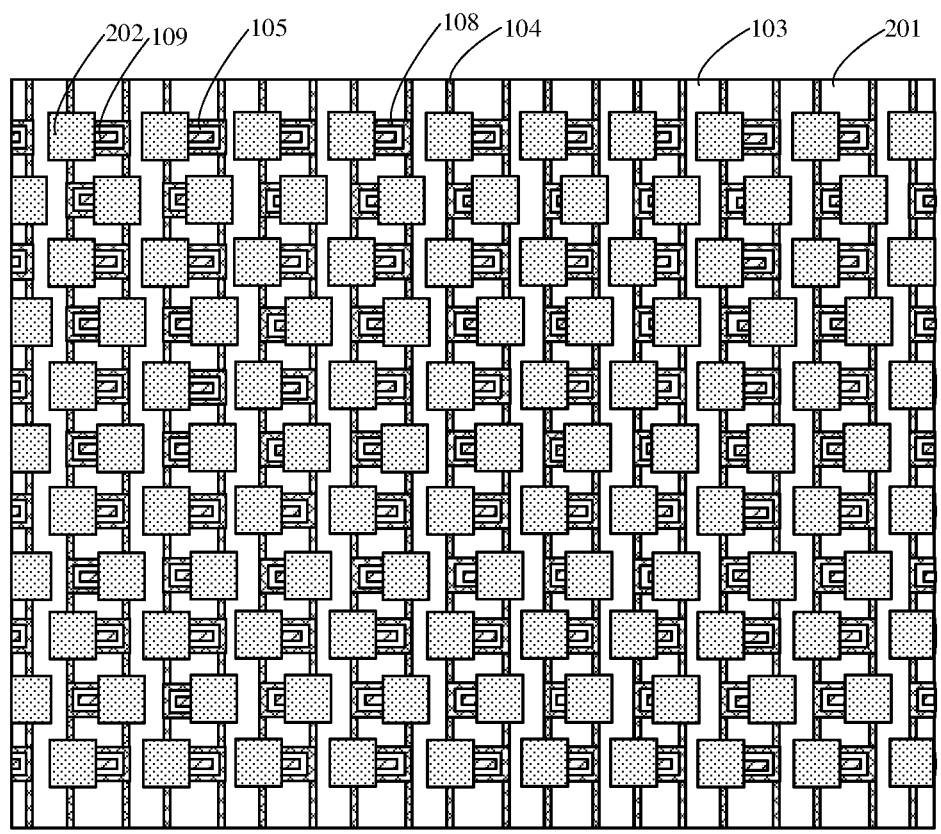
Figure 17:
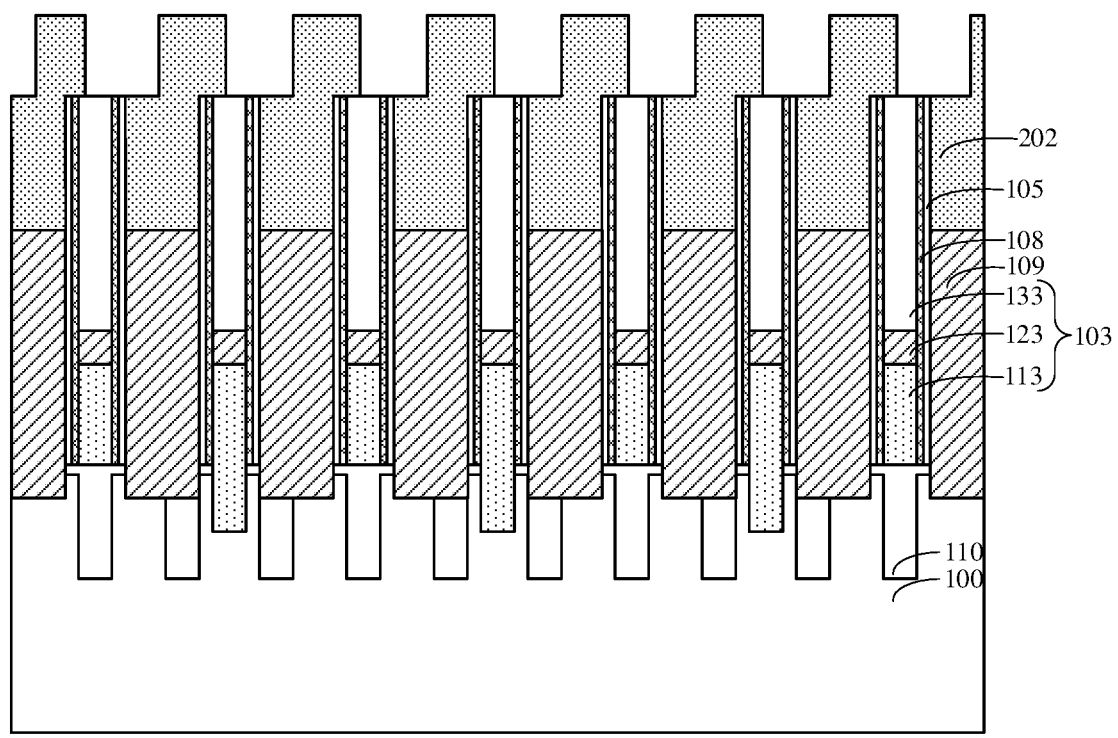

Referring to FIG. 15 to FIG. 17, a contact structure 202 is formed on the contact plug 109.

Specifically, referring to FIG. 15, a top conductive layer 212 is formed on the top surface of the contact plug 109 and the top surface of the bit line structure 103.

The top conductive layer 212 may be a single conductive material or may be composed of more conductive materials, such as doped polysilicon, titanium, titanium nitride, tungsten and tungsten composites. In the example, the top conductive layer 212 is made of tungsten which has a low resistance, so that the transmission loss of the current can be further reduced.

Referring to FIG. 16 and FIG. 17, the top conductive layer 212 is patterned to form contact structures 202. Each contact structure 202 includes a part that is higher than the top surface of the bit line structure 103 and a part that is lower than the top surface of the bit line structure 103. The part that is lower than the top surface of the bit line structures 103 and the contact plug 109 together form a contact window. The part that is higher than the top surface of the bit line structure 103 is used as landing pad to form an electrical connection with the subsequently formed storage unit.

Figure 18:
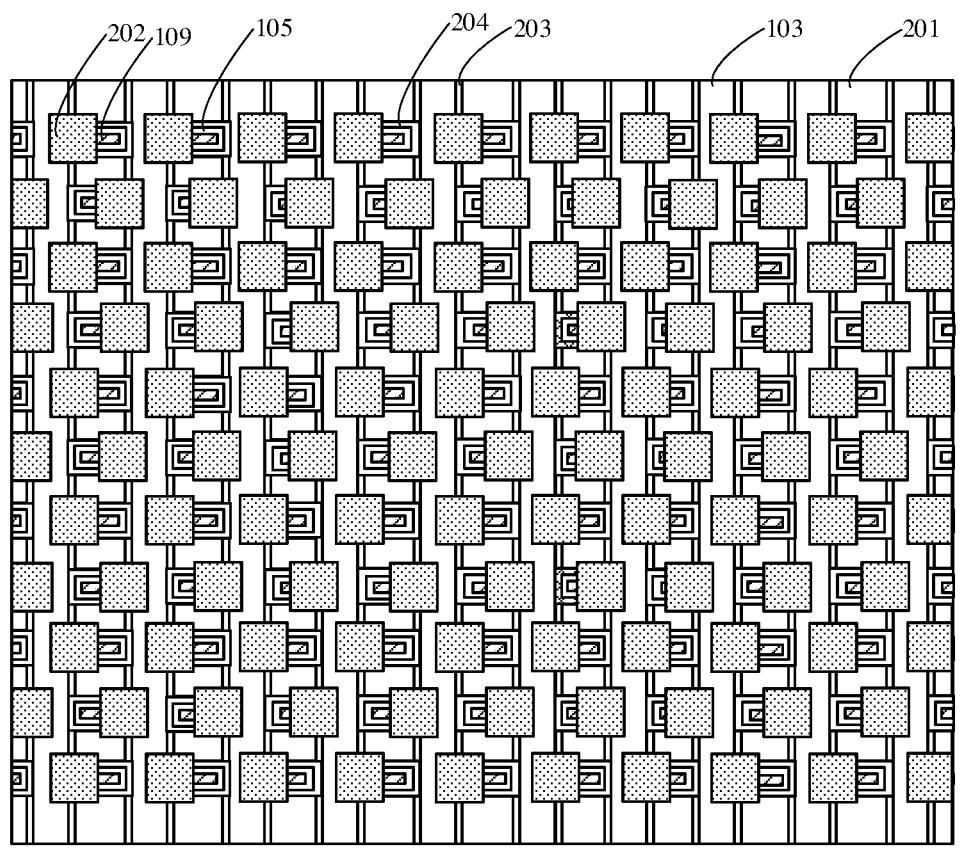
Figure 19:
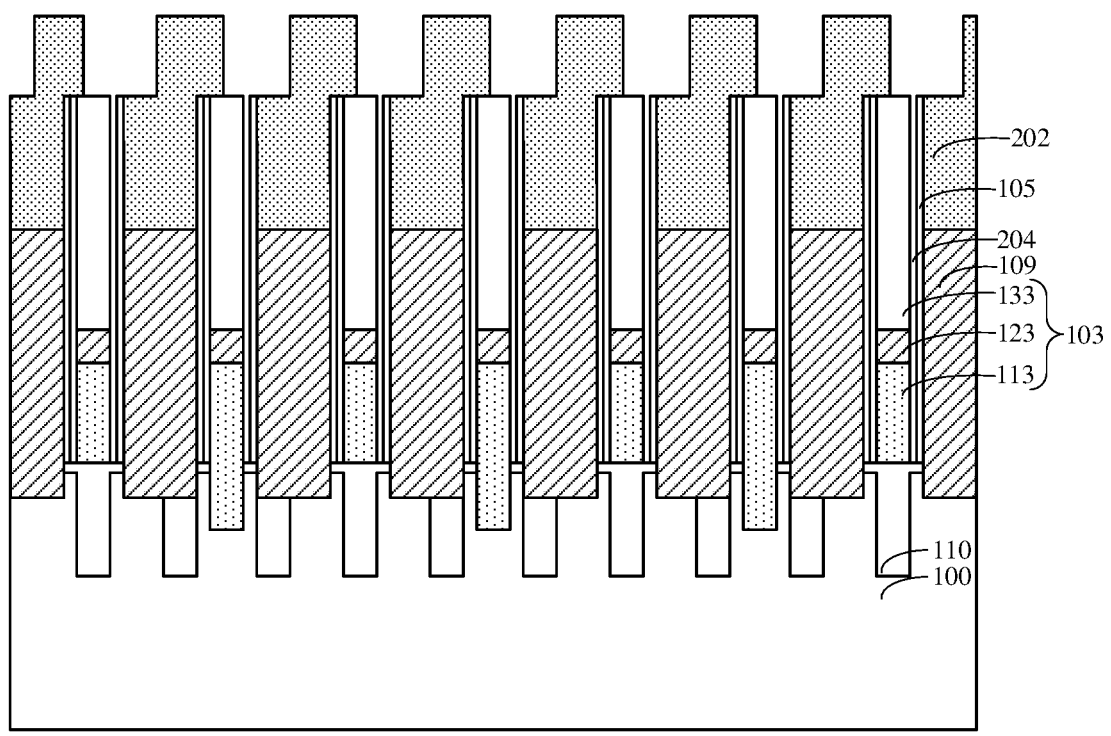

Referring to FIG. 18 and FIG. 19, the first sacrificial layer 104 is removed to form the first air gaps 203, and the second sacrificial layer 108 is removed to form the second air gaps. The processes are shown by partial schematic views of FIG. 23 and FIG. 24.

In the example, the first sacrificial layer 104 and the second sacrificial layer 108 are removed by means of incineration or wet etching.

Specifically, the sacrificial layer is removed by an incineration process to form the air gaps, and the width of the formed air gaps is approximately equal to the thickness of the sacrificial layer. The parameters of the incineration process include the flow rate of the incineration gas being 10000 sccm to 15000 sccm, the temperature being 150° C. to 350° C., and the pressure being 500 mT to 800 mT. Specifically, the gas flow rate may be 11000 sccm, 12000 sccm, 13000 sccm or 14000 sccm, the temperature may be 200° C., 250° C. or 300° C., and the pressure may be 600 mT or 700 mT. It should be noted that the above examples of gas flow rate parameters, temperature parameters and pressure parameters are only for the understanding of those skilled in the art, and do not mean to limit the solution. In practical disclosure, the parameters in the above range shall fall within the protection scope of the disclosure.

The incineration gas used in the incineration process includes one or more of nitrogen, hydrogen or oxygen. The incineration gas has a chemical reaction with the sacrificial layer which is made of a carbon-containing material, thus the solid sacrificial layer generates gaseous carbon dioxide, and the solid is converted to the gas, and the air gaps are formed. During formation of the air gaps by the incineration process, no larger impact force is applied to the side walls of the air gaps, so that the phenomenon of collapse of the side walls of outer layer is avoided.

At this time, each of the formed second air gaps 204 is located between the isolation layer 105 and a bit line structure 103 and also located between the isolation layer 105 and the second dielectric layer 201, a formed first air gap 203 is located between a bit line structure 103 and the second dielectric layer 201, and each first air gap 203 between two adjacent bit line structures 103 is communicated with a corresponding second air gap 204.

Figure 23:
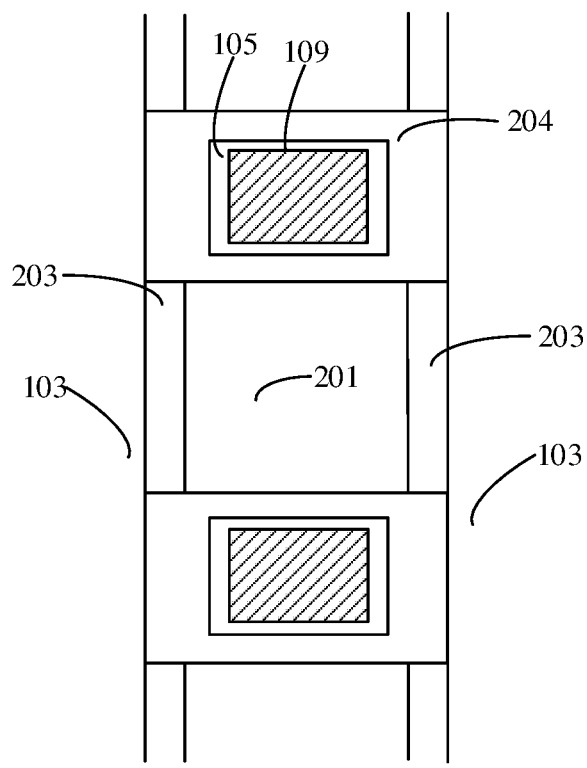
FIG. 23 and FIG. 24 are partially enlarged views of the air gaps forming with the method for forming a semiconductor structure provided by an example of the disclosure.

Referring to FIG. 23, the first air gaps 203, the second air gaps 204, the isolation layers 105, the contact plugs 109 and the second dielectric layers 201 are comprised between the two adjacent bit line structures 103. The first air gaps 203 are located between bit line structures 103 and a second dielectric layer 201. Along the extension direction of the bit line structures 103, the second dielectric layers 201 and the contact plugs 109 are alternately arranged, the isolation layer 105 is located on the side walls of the contact plug 109, the second air gap 204 surrounds the side walls of the isolation layer 105, and the first air gaps 203 on the side walls of the bit line structure 103 is communicated with the second air gaps 204. In other examples, the position of the second dielectric layer may also be a first dielectric layer.

Figure 24:
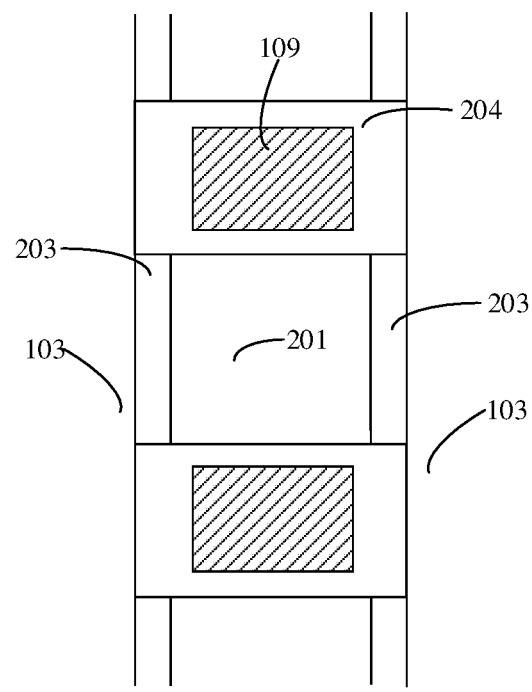

In other examples where the isolation layer is not formed, referring to FIG. 24, the first air gaps 203, the second air gaps 204, the contact plugs 109 and the second dielectric layers 201 are comprised between the two adjacent bit line structures 103. The first air gaps 203 are located between a bit line structure 103 and a second dielectric layer 201. Along the extension direction of the bit line structures 103, the second dielectric layers 201 and the contact plugs 109 are alternately arranged, a second air gap 204 surrounds the side walls of each contact plugs 109, and the first air gaps 203 on a side wall of each bit line structure 103 is interconnected with the second air gaps 204. In other examples, the position of the second dielectric layer may also be a first dielectric layer.

Figure 20:
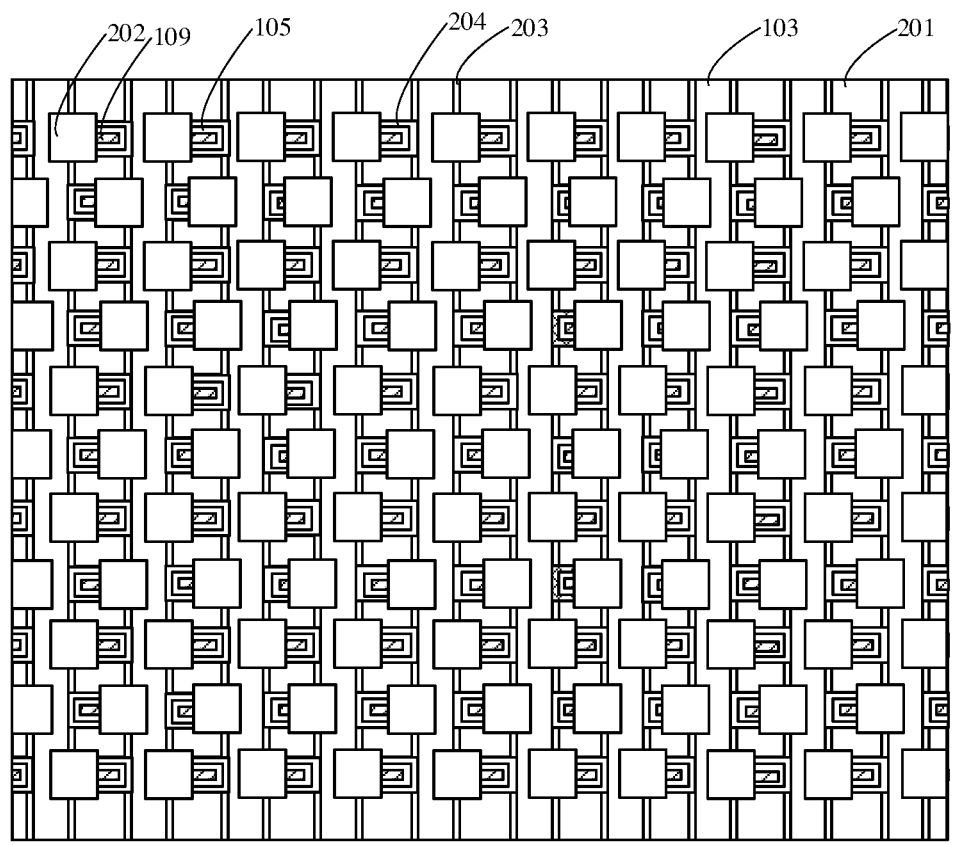
Figure 21:
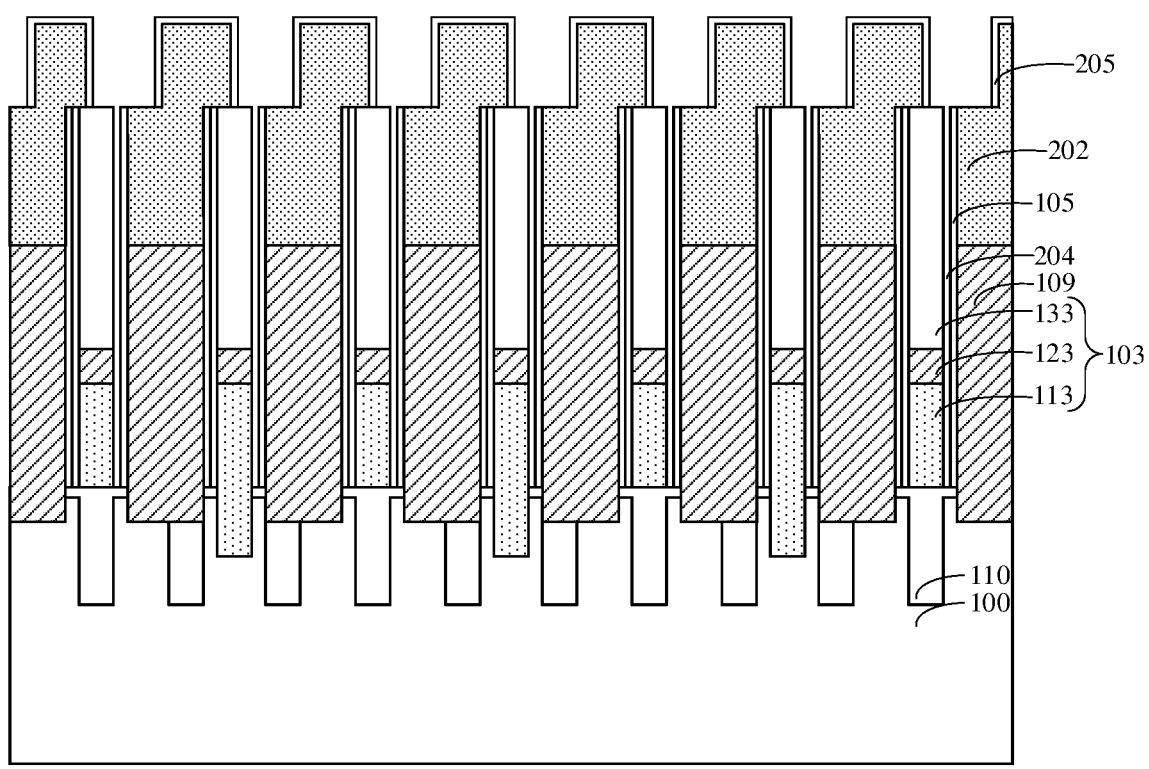

Referring to FIG. 20 and FIG. 21, a barrier layer 205 is formed on the top surfaces and side walls of the contact structures. By forming the barrier layer between the contact structures 202 and the subsequently formed sealing layer, conductive particles in the contact structures 202 are prevented from diffusing into the sealing layer, thereby forming an electrical connection between the separate contact structures 202.

Figure 22:
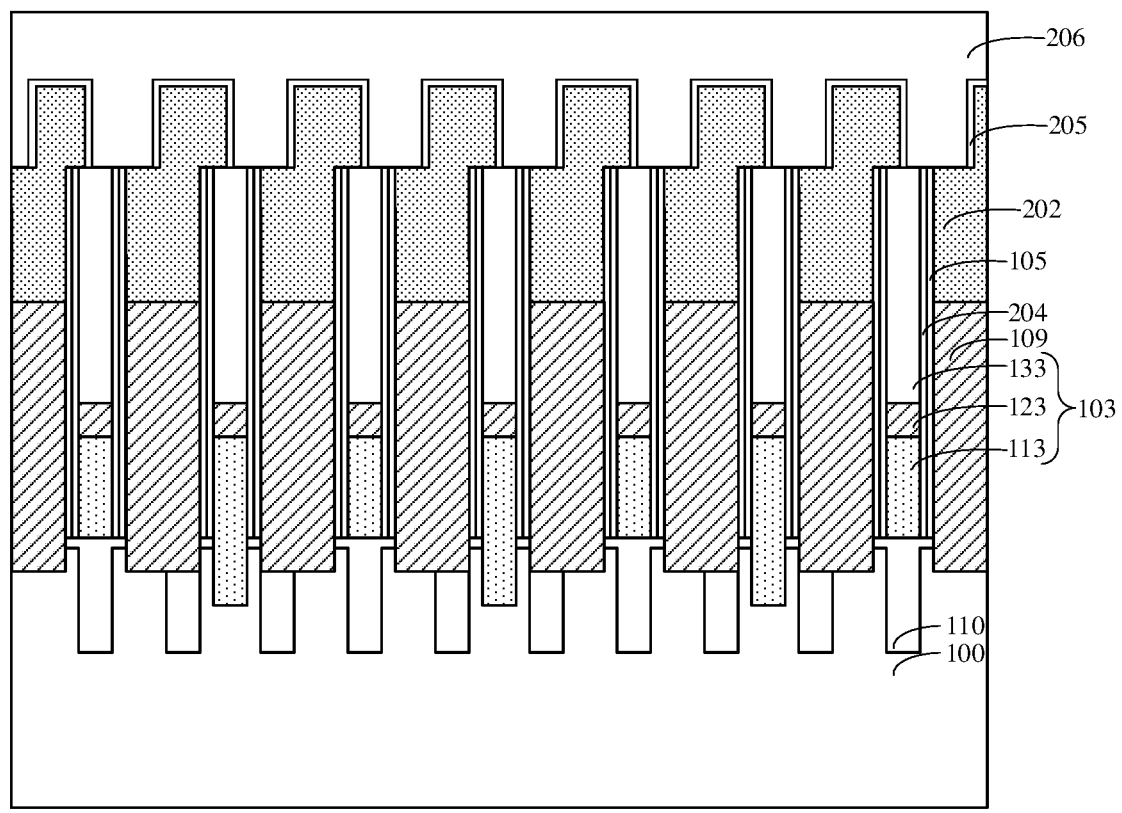

Referring to FIG. 22, the first air gap and the second air gap are sealed to form a sealing layer 206 located on the top portions of the air gap, and the level of the top surface of the sealing layer 206 is higher than that of the top surface of the contact structure 202.

Compared with the related technique, the first sacrificial layer is formed on the side walls of the bit line structures, and the second sacrificial layer is formed on the side walls of the contact plugs. In the subsequent manufacturing processes, by removing the first sacrificial layer and the second sacrificial layer, the first air gaps on the side walls of the bit line structures and the second air gaps on the side walls of the contact plugs are formed. Compared with the related technique only forming one layer of air gap, by forming two layers of air gap, the effect of reducing parasitic capacitance is better, and the formed air gaps are easily to be sealed.

The division of the above operations is only for clarity of description. When implemented, the operations can be combined into one operation or some operation can be split into more operations. As long as they include the same logical relationship, they are all within the protection scope of the patent. Adding insignificant modifications or introducing insignificant designs to the process without changing the core design of the process are all within the protection scope of the patent.

A second example of the disclosure relates to a semiconductor structure.

Referring to FIG. 20 and FIG. 22, the semiconductor structure provided by this example will be described in detail below with reference to the drawings, and the parts that are the same as or corresponding to the above examples will not be described in detail below.

The semiconductor structure includes a substrate 100 and separate bit line structures 103 located on the substrate 100; dielectric layers 201 and contact plugs 109 located in a gap between adjacent separate bit line structures 103, wherein along the extension direction of the bit line structures 103, the contact plugs 109 and the dielectric layers 201 are alternately arranged; a contact structure 202 located on each contact plug 109; a first air gap 203 located between a dielectric layer 201 and a bit line structure 103; and a second air gap 204 surrounding each contact plug 109, and a part of the second air gap 204 is located between a bit line structure 103 and a contact plug 109 adjacent thereto.

The material of the substrate 100 may include sapphire, silicon, silicon carbide, gallium arsenide, aluminum nitride or zinc oxide and the like. In the example, the substrate 100 is made of a silicon material. It should be clear to those skilled in the art that the use of the silicon material as the substrate 100 in the example is to facilitate the understanding of the subsequent forming method by those skilled in the art, and does not constitute a limitation. In a practical disclosure, suitable substrate materials may be selected based on requirements.

A plurality of active regions 101 are arranged in parallel at intervals, a word line structure 102 and a bit line structure 103 are perpendicular to each other, and a single active region 101 is overlapped with two word line structures 102. It should be noted that the substrate 100 further includes other semiconductor structures in addition to the word line structure 102 and the active region 101, such as shallow trench isolation structure 110 (referring to FIG. 2), etc. Since other semiconductor structures do not involve the key solution of the disclosure, other semiconductor structures will not be described herein. Those skilled in the art can understand that the substrate 100 further includes other semiconductor structures in addition to the word line structure 102 and the active region 101 for normal operation of the semiconductor structure.

The extension direction of a bit line structure 103 is perpendicular to the extension direction of a word line structure 102. Each of the bit line structure 103 includes a bit line contact layer 113, a metal layer 123 and a top dielectric layer 133 which are stacked in sequence. On a cross section perpendicular to the extension direction of the bit line structure 103, only one of the two adjacent bit line structures 103 is connected to the active region 101 in the substrate 100.

The material of the bit line contact layer 113 includes tungsten or polysilicon. The metal layer 123 may be one single conductive material or may be composed of more conductive materials, such as doped polysilicon, titanium, titanium nitride, tungsten and tungsten composites. The material of the top dielectric layer 133 includes silicon nitride, silicon dioxide or silicon oxynitride. In the example, the material of the top dielectric layer 133 is silicon nitride.

The material of the dielectric layer 201 is same as the material of the top dielectric layer 133. The material of the contact plug 109 is polysilicon or silicon germanide for forming an electrical connection with the active region 101 in the substrate 100.

A contact structure 202 includes a part that is higher than the top surface of the bit line structures 103 and a part in a gap between two adjacent bit line structures 103. The part of the contact structure that is lower than the top surface of the bit line structure 103 and the contact plug 109 together form a contact window. The part that is higher than the top surface of the bit line structure 103 is used as a landing pad to form an electrical connection with the subsequently formed storage unit. Specifically, the contact plugs 109 are distributed in an aligned array, and the contact structures 202 are distributed in a staggered array. The projections on the substrate of the contact structures 202 and the contact plugs 109 are partially overlapped, so that the first sacrificial layer 104 and the second sacrificial layer 108 are at least partially exposed to facilitate the subsequent etching to form air gaps. In this example, the contact structure 202 may be a conductive material or may be composed of multiple conductive materials, such as doped polysilicon, titanium, titanium nitride, tungsten and tungsten composites. In the example, the contact structure 202 is made of tungsten which has low resistance, so that the transmission loss of the current can be further reduced.

In the example, the first air gap 203 on the side wall of the bit line structure 103 is communicated with the second air gap 204.

In the example, the width of the second air gap 204 is greater than the width of the first air gap 203. Specifically, the width of the second air gap 204 is 1 nm to 6 nm, such as 1 nm, 2 nm, 3 nm, 4 nm or 5 nm, and the width of the first air gap 203 is 0.1 nm to 5 nm, such as 0.5 nm, 1.0 nm, 1.5 nm, 2.0 nm, 2.5 nm, 3.0 nm, 3.5 nm, 4.0 nm or 4.5 nm.

In the example, the semiconductor structure further includes an isolation layer 105, and the isolation layer 105 is located between the second air gap 204 and the contact plug 109. That is, the isolation layer 105 is arranged around the side walls of a contact plug 109, and the second air gap 204 is arranged around the side walls of the isolation layer 105. The material of the isolation layer 105 is an insulating material, such as silicon nitride, silicon oxynitride or silicon oxide and the like. In the example, the material of the isolation layer 105 is same as the material of the top dielectric layer 133, that is, the material of the isolation layer 105 is silicon nitride.

Compared with the related technique, the example includes the first air gaps on a side wall of each bit line structure and the second air gaps on the side walls of each contact plug. Compared with the related technique only forming one layer of air gap, by forming two layers of air gap, the effect of reducing parasitic capacitance is improved, and the formed air gaps are easily to be sealed.

Since the above examples and the example correspond to each other, the example can be implemented in cooperation with the above examples. The related technical details mentioned in the above examples are still valid in the example, and the technical effects that can be achieved in the above examples can also be achieved in this example. In order to reduce repetition, the details are not described here. Correspondingly, the related technical details mentioned in this example can also be applied to the above examples.

A person of ordinary skill in the art can understand that the above examples are specific examples for implementing the disclosure. In practical disclosures, various changes can be made in form and details without departing from the spirit and scope of the disclosure.

The invention claimed is:

1. A method for forming a semiconductor structure, comprising:
   providing a substrate, wherein separate bit line structures are formed on the substrate;
   forming a first sacrificial layer on a side wall of each of the bit line structures;
   forming a first dielectric layer filling each gap between the bit line structures;
   patterning the first dielectric layer and the first sacrificial layer to form through holes, wherein along an extension direction of the bit line structures, the through holes and a remaining portion of the first dielectric layer and the first sacrificial layer are alternately arranged, and the through holes expose active regions in the substrate and the side wall of each of the bit line structures;
   forming a second sacrificial layer on a side wall of each of the through holes, and filling each of the through holes to form a contact plug surrounded with an isolation layer;
   forming a contact structure on the contact plug; and
   removing the remaining portion of the first sacrificial layer to form a first air gap, and removing the second sacrificial layer to form a second air gap; wherein the first air gaps located only between the dielectric layers and the bit line structures, a part of each of the second air gaps is located between a corresponding bit line structure and a corresponding contact plug of the contact plugs and expose a side wall of the corresponding bit line structure, the second air gap surrounds the contact structure and the isolation layer, and the second air gap is located on the substrate.

2. The method for forming the semiconductor structure of claim 1, wherein patterning the first dielectric layer and the first sacrificial layer to form the through holes comprises:
forming a first mask layer on the bit line structures and the first dielectric layer;
patterning the first mask layer to form first etching openings, wherein along the extension direction of the bit line structures, the first mask layer and the first etching openings are alternately arranged; and
etching the exposed first dielectric layer and the first sacrificial layer on the side wall of each of the bit line structures based on the first etching openings to form the through holes.

3. The method for forming the semiconductor structure of claim 2, comprising partially etching the substrate exposed by the through holes.

4. The method for forming the semiconductor structure of claim 1, wherein patterning the first dielectric layer and the first sacrificial layer to form the through holes comprises:
forming a first mask layer on the bit line structures and the first dielectric layer;
patterning the first mask layer to form first etching openings, wherein along the extension direction of the bit line structures, the first mask layer and the first etching openings are alternately arranged;
removing a part of the first dielectric layer by means of the first etching openings;
forming a second mask layer on the remaining portion of the first dielectric layer;
patterning the second mask layer to form second etching openings, wherein the second etching openings expose the first sacrificial layer on a side wall of each of the first etching openings; and
removing the first sacrificial layer on the side wall of each of the first etching openings based on the second etching openings to form the through holes.

5. The method for forming the semiconductor structure of claim 1, wherein after filling each of the through holes to form the contact plug and before forming the contact structure on the contact plug, the method further comprises: removing the remaining portion of the first dielectric layer to form dielectric openings; and forming a second dielectric layer that fills in the dielectric openings.

6. The method for forming the semiconductor structure of claim 1, wherein a thickness of the second sacrificial layer is greater than a thickness of the first sacrificial layer.

7. The method for forming the semiconductor structure of claim 1, wherein filling each of the through holes to form the contact plug comprises:
forming a bottom conductive layer that fills in each of the through holes; and
etching a part of the bottom conductive layer to form the contact plug, wherein a top surface of the contact plug is lower than a top surface of the bit line structures.

8. The method for forming the semiconductor structure of claim 7, wherein before forming the bottom conductive layer that fills in each of the through holes, the method further comprises: forming the isolation layer on the side wall of each of the through holes.

9. The method for forming the semiconductor structure of claim 1, wherein after filling each of the through holes to form the contact plug and before forming the contact structure on the contact plug, the method further comprising: forming an electrical connection layer on the contact plug.

10. The method for forming the semiconductor structure of claim 1, further comprising: sealing the first air gap and the second air gap to form a sealing layer located on top portions of the first air gap and the second air gap.

11. The method for forming the semiconductor structure of claim 10, wherein before sealing the first air gap and the second air gap, the method further comprises: forming a barrier layer on a side wall of the contact structure.

12. A semiconductor structure, comprising:
a substrate and separate bit line structures located on the substrate;
dielectric layers and contact plugs, wherein the dielectric layers and the contact plugs are located in gaps between the bit line structures, and along an extension direction of the bit line structures, the contact plugs and the dielectric layers are alternately arranged;
an isolation layer arranged around side walls of each of the contact plugs;
contact structures located on each of the contact plugs;
first air gaps located only between the dielectric layers and the bit line structures; and
second air gaps surrounding each of the contact plugs and the isolation layer, wherein a part of each of the second air gaps is located between a corresponding bit line structure and a corresponding contact plug of the contact plugs, and expose a side wall of the corresponding bit line structure;
wherein the second air gaps are located on the substrate.

13. The semiconductor structure of claim 12, wherein each of the first air gaps on a side wall of each of the bit line structures is in communication with an adjacent one of the second air gaps.

14. The semiconductor structure of claim 12, wherein a width of the second air gaps is greater than a width of the first air gaps.

15. The semiconductor structure of claim 14, wherein the width of the first air gaps is in a range of 0.1 nm to 5 nm.

16. The semiconductor structure of claim 12, wherein projections on the substrate of the contact structures and the contact plugs are partially overlapped.

17. The semiconductor structure of claim 16, wherein the contact plugs are distributed in an aligned array, and the contact structures are distributed in a staggered array.

18. The semiconductor structure of claim 17, wherein each of the contact structures is partially located in a corresponding gap of the gaps between the bit line structures.

19. The semiconductor structure of claim 12, wherein the first air gaps and the second air gaps are alternately arranged on a side wall of each of the bit line structures along the extension direction of the bit line structures.

* * * * *